(12) United States Patent
Moon et al.

(10) Patent No.: US 11,193,988 B2
(45) Date of Patent: Dec. 7, 2021

(54) METHOD OF AND APPARATUS FOR MEASURING MAGNITUDE OF MAGNETIZATION OF PERPENDICULAR THIN FILM

(71) Applicants: KOREA RESEARCH INSTITUTE OF STANDARDS AND SCIENCE, Daejeon (KR); KOREA INSTITUTE OF SCIENCE AND TECHNOLOGY, Seoul (KR); KOREA BASIC SCIENCE INSTITUTE, Daejeon (KR)

(72) Inventors: Kyoung-Woong Moon, Daejeon (KR); Chan Yong Hwang, Seoul (KR); Byoung-Chul Min, Seoul (KR); Seung-young Park, Daejeon (KR)

(73) Assignees: Korea Research Institute of Standards and Science; Korea Institute of Science and Technology; Korea Basic Science Institute

( * ) Notice: Subject to any disclaimer, the term of this patent is extended or adjusted under 35 U.S.C. 154(b) by 214 days.

(21) Appl. No.: 16/687,213

(22) Filed: Nov. 18, 2019

(65) Prior Publication Data

US 2020/0191884 A1 Jun. 18, 2020

(30) Foreign Application Priority Data

Dec. 12, 2018 (KR) .................. 10-2018-0159881

(51) Int. Cl.
*G01R 33/05* (2006.01)
*H01F 10/30* (2006.01)
(Continued)

(52) U.S. Cl.
CPC ......... *G01R 33/05* (2013.01); *G01R 33/0017* (2013.01); *G01R 33/032* (2013.01);
(Continued)

(58) Field of Classification Search
CPC .. G01R 33/05; G01R 33/0017; G01R 33/032; G01R 33/1215; G01R 33/1292;
(Continued)

(56) References Cited

U.S. PATENT DOCUMENTS 5,500,589 A * 3/1996 Sumcad ................. G01R 33/00
324/202
2006/0132278 A1* 6/2006 Reyal .................. H01F 41/0226
336/234
(Continued)

*Primary Examiner* — Jermele M Hollington
*Assistant Examiner* — Taqi R Nasir
(74) *Attorney, Agent, or Firm* — Mendelsohn Dunleavy, P.C.

(57) ABSTRACT

Provided is a method of measuring a magnitude of magnetization of a perpendicular magnetic thin film, including: forming a stripe pattern in which a first magnetic domain that extends in a y direction and is magnetized in a z direction and a second magnetic domain that extends in the y direction and is magnetized in a direction opposite to the z direction are arranged alternately in an x direction, in a perpendicular magnetic thin film that extends in an xy plane; changing widths in the x direction, of the first and second magnetic domains by applying a magnetic field having a predetermined magnitude, in the z direction, to the perpendicular magnetic thin film; and calculating an absolute value of the magnetization of the perpendicular magnetic thin film on the basis of a ratio between the widths in the x direction, of the first magnetic domain and the second magnetic domain.

13 Claims, 10 Drawing Sheets

(51) Int. Cl.
*G01R 33/12* (2006.01)
*G01R 33/00* (2006.01)
*G01R 33/032* (2006.01)
*H01F 10/32* (2006.01)

(52) U.S. Cl.
CPC ..... *G01R 33/1215* (2013.01); *G01R 33/1292* (2013.01); *H01F 10/30* (2013.01); *H01F 10/3236* (2013.01)

(58) Field of Classification Search
CPC ............... G01R 33/00; G01R 33/0035; G01R 33/0023; G01R 31/3191; H01F 10/30; H01F 10/3236; G01B 7/004; G01C 17/38; G06F 3/017; G06F 3/0346; G06F 3/012
See application file for complete search history.

(56) References Cited

U.S. PATENT DOCUMENTS

2011/0095754 A1* 4/2011 Morel .................... G01R 33/05
324/244
2019/0178684 A1* 6/2019 Marauska .......... G01R 33/0017

\* cited by examiner

METHOD OF AND APPARATUS FOR MEASURING MAGNITUDE OF MAGNETIZATION OF PERPENDICULAR THIN FILM

STATEMENT OF GOVERNMENTAL SUPPORT

This invention was made with government support under Project No. CAP-16-01-KIST awarded by Creative Allied Project (CAP) through the National Research Council of Science & Technology (NST) funded by the Ministry of Science and ICT. The government support was made at a contribution rate of 1/1 for the research period of Jul. 1, 2016 through Jun. 30, 2019. The supervising institute was KOREA RESEARCH INSTITUTE OF STANDARDS AND SCIENCE, KOREA INSTITUTE OF SCIENCE AND TECHNOLOGY and KOREA BASIC SCIENCE INSTITUTE.

BACKGROUND OF THE INVENTION

Field of the Invention

The present invention relates to measurement of a magnitude of magnetization and, more particularly, to a method of and an apparatus for measuring a magnitude of magnetization by forming a stripe pattern in a perpendicular magnetic thin film.

Description of the Related Art

Magnetization is a basic property of a magnetic body and is a value of a vector having a magnitude and a direction. However, most of magnetic imaging technologies in the related art measure only a relative direction of the magnetization.

In this connection, measurement of a magnitude of magnetization is described in "Measurement of magnetization using domain compressibility in CoFeB films with perpendicular anisotropy," which is a treatise in Appl. Phys. Lett. 104, 122404 (2014) published by the American Institute of Physics.

However, this treatise describes only measurement of magnetization that results in a case where one stripe, that is, one magnetic domain, is formed.

SUMMARY OF THE INVENTION

An objective of the present invention is to provide a method and an apparatus that are capable of measuring a magnitude of magnetization of a perpendicular magnetic thin film by forming a stripe pattern in multiple magnetic domains are arranged in the perpendicular magnetic thin film.

According to an aspect of the present invention, there is provided a method of measuring a magnitude of magnetization of a perpendicular magnetic thin film, the method including: forming a stripe pattern in which a first magnetic domain that extends in a y direction and is magnetized in a positive z direction and a second magnetic domain that extends in the y direction and is magnetized in a negative z direction are arranged alternately in an x direction, in a perpendicular magnetic thin film that extends in an xy plane; changing widths in the x direction, of the first magnetic domain and the second magnetic domain by applying a magnetic field having a predetermined magnitude, in the z direction, to the perpendicular magnetic thin film; and calculating an absolute value of the magnetization of the perpendicular magnetic thin film on the basis of a ratio between the widths in the x direction, of the first magnetic domain and the second magnetic domain.

According to another aspect of the present invention, there is provided an apparatus for measuring a magnitude of magnetization of a perpendicular magnetic thin film, the apparatus including: a pattern formation unit that forms a stripe pattern in which a first magnetic domain that extends in a y direction and is magnetized in a positive z direction and a second magnetic domain that extends in the y direction and is magnetized in a negative z direction are arranged alternately in an x direction, in a perpendicular magnetic thin film that extends in an xy plane; a magnetic field supply unit that changes widths in the x direction, of the first magnetic domain and the second magnetic domain by applying a magnetic field having a predetermined magnitude, in a z direction, to the perpendicular magnetic thin film, and a calculation unit that calculates an absolute value of the magnitude of the magnetization of the perpendicular magnetic thin film on the basis of a ratio between the widths in the x direction, of the first magnetic domain and the second magnetic domain.

According to an embodiment of the present invention, the magnitude of the magnetization of the perpendicular magnetic thin film can be measured.

DETAILED DESCRIPTION OF THE INVENTION

An embodiment of the present invention will be described in detail below with reference to the accompanying drawings.

Figure 1A:
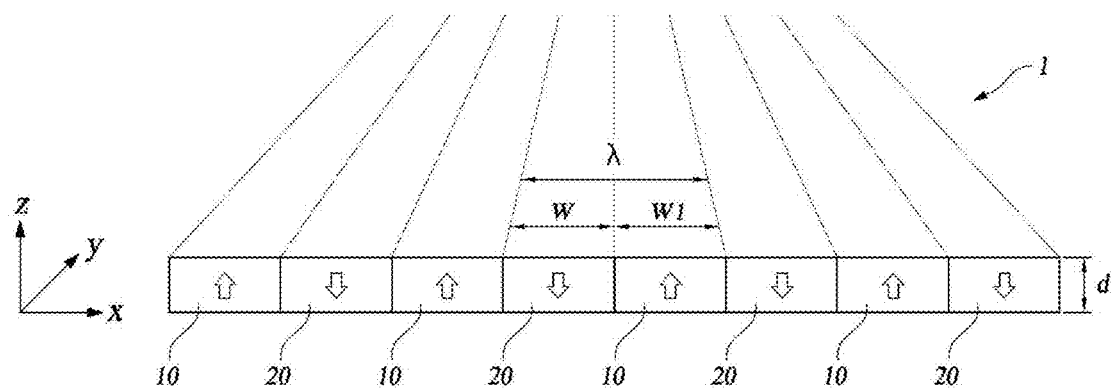
FIGS. 1A and 1B are diagrams for describing a perpendicular magnetic thin film having a stripe pattern according to an embodiment of the present invention.
Figure 1B:
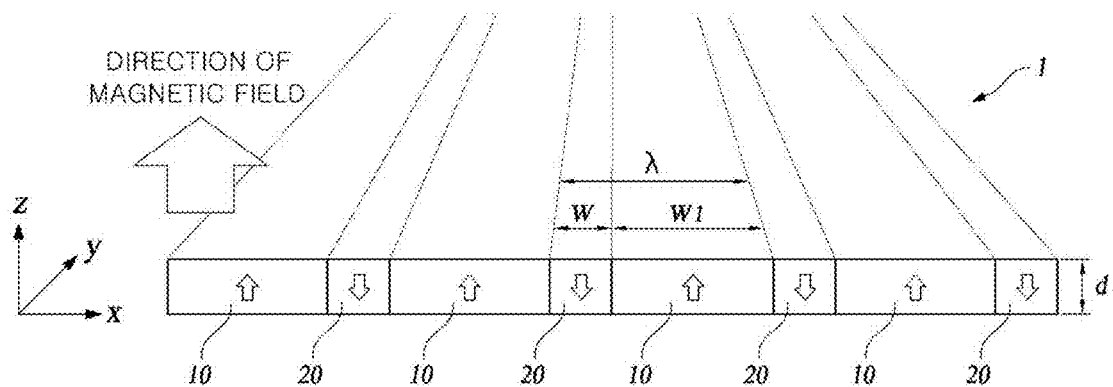

FIGS. 1A and 1B are diagrams for describing a perpendicular magnetic thin film 1 having a stripe pattern according to the embodiment of the present invention. It is assumed that a perpendicular magnetic thin film 1 extends in an xy plane and has a thickness d in the z direction. In the present specification, an x direction, a y direction, and a z direction indicate three arbitrary directions, respectively, that are perpendicular to each other, without indicating specific absolute directions, respectively.

FIG. 1A illustrates the perpendicular magnetic thin film 1 in a state where a magnetic field in a perpendicular direction (the z direction) is not applied.

With reference to FIG. 1A, the perpendicular magnetic thin film 1 may have a stripe pattern in which a first magnetic domain 10 that is magnetized in the positive z direction and a second magnetic domain 20 that is magnetized in the negative z direction are arranged alternately. The first magnetic domain 10 and the second magnetic domain 20 extend in the y direction and extend in the x direction. In order to minimize magnetic dipole energy, for the perpendicular magnetic thin film 1, a state where the first magnetic domain 10 and the second magnetic domain 20 are the same in width (half-up and half-down magnetization) is preferable. That is, a periodicity of the stripe pattern of the perpendicular magnetic thin film 1 is defined as $\lambda$, a width w1 of the first magnetic domain 10 and a width w of the second magnetic domain 20 are both $\lambda/2$.

FIG. 1B illustrates the perpendicular magnetic thin film 1 in a state where a magnetic field in the perpendicular direction (the positive z direction) is applied.

When a magnetic field is applied in the positive z direction to the perpendicular magnetic thin film 1 having a stripe pattern, the width w1 of the first magnetic domain 10 magnetized in a direction that is the same as a direction of the magnetic field increases, and the width w of the second magnetic domain 20 magnetized in a direction opposite to the direction of the magnetic field decreases. That is, in FIG. 1B, w1>$\lambda/2$ and w<$\lambda/2$.

The inventor of the present invention found out that, when a periodicity with which the first magnetic domain 10 and the second magnetic domain 20 recur is defined as $\lambda$ and R is defined as Equation (1), thus Equation (2) was established.

$$R = (\lambda - 2w)/\lambda \quad (1)$$

$$\mu_0 M = \frac{2\lambda}{\pi d} \frac{H_z}{R} \quad (2)$$

where M denotes a magnitude of magnetization of a perpendicular magnetic thin film, of which a unit A/m, $\mu_0$ denotes a permeability of $4\pi10^{-7}$ H/m, $H_z$ denotes a magnitude of a magnetic field of which a unit T, and units of $\lambda$, w, and d are m.

In Equation (2), $\mu_0$ is a constant, $\lambda$ and d are values that can be obtained by measuring the perpendicular magnetic thin film, and Hz is a magnitude of the applied magnetic field and thus is a value that can also be obtained. Therefore, the magnitude of the magnetization of the perpendicular magnetic thin film can be obtained by measuring R.

At this time, Equation (1) can be rewritten as follows, using $\lambda$=w1+w.

$$R=(\lambda-2w)/\lambda=(w1+w-2w)/(w1+w)=(w1-w)/(w1+w)=(1-w/w1)/(1+w/w1) \quad (3)$$

From Equation (3), it can be seen that R is determined by w/w1. As a result, it can be understood that the magnitude of the magnetization of the perpendicular magnetic thin film is also determined by w/w1, that is, a ratio between the widths of the first magnetic domain 10 and the second magnetic domain 20.

An apparatus and a method for measuring the magnitude of the magnetization of the perpendicular magnetic thin film using this principle will be described below.

Figure 2:
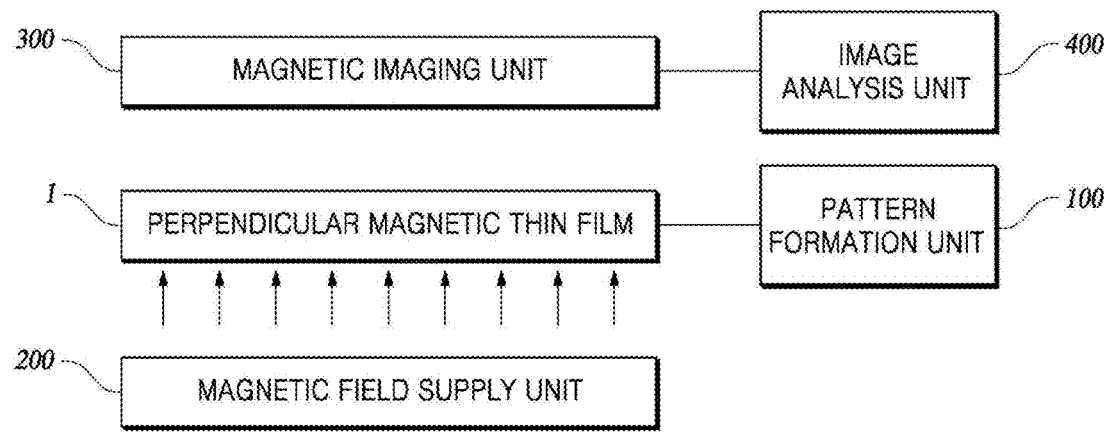
FIG. 2 is a diagram illustrating a configuration of a magnetization measurement apparatus according to the embodiment of the present invention.

FIG. 2 is a diagram illustrating a configuration of a magnetization measurement apparatus 1 according to the embodiment of the present invention.

With reference to FIG. 2, the magnetization measurement apparatus 1 includes a pattern formation unit 100, a magnetic field supply unit 200, a magnetic imaging unit 300, and an image analysis unit 400.

The pattern formation unit 100 also forms magnetism of the stripe pattern, as illustrated in FIG. 1A, in the perpendicular magnetic thin film 1. That is, the pattern formation unit 100 forms the magnetism of the stripe pattern in the perpendicular magnetic thin film 1 that extends in the xy plane, in such a manner that the first magnetic domain 10 that extends in the Y direction and is magnetized in the positive z direction and the second magnetic domain 20 that extends in the y direction and is magnetized in the negative z direction are arranged alternately in the x direction. Methods of forming the stripe pattern, of which there are many, will be described below. FIG. 2 illustrates that the pattern formation unit 100 is connected to the perpendicular magnetic thin film 1, but the pattern formation unit 100 may or may not be in physical contact with the perpendicular magnetic thin film 1.

The magnetic field supply unit 200 applies a magnetic field having a predetermined magnitude, in the positive z direction, to the perpendicular magnetic thin film 1. Accordingly, as described with reference to FIGS. 1A and 1B, the width w1 of the first magnetic domain of the perpendicular magnetic thin film 1 and the width w of the second magnetic domain change. The magnetic field supply unit 200 may be a magnet or an electromagnet. The electromagnet is desirable in that the strength of the magnetic field can be adjusted.

The magnetic imaging unit 300 measures brightness of the perpendicular magnetic thin film to which the magnetic field is applied. For example, regarding the brightness of the perpendicular magnetic thin film, a portion that is magnetized in the positive z direction, that is, the first magnetic domain 10, can appear to be bright, and a portion that is magnetized in the negative z direction, that is, the second magnetic domain 20, can appear to be dark. As the magnetic imaging unit 300, an existing apparatus can be used such as a MOKE microscope, a Faraday microscope, a SEMPA, a SPLEEM, or an MFM, which is used for magnetic imaging.

The image analysis unit 400 calculates an absolute value of the magnetization of the perpendicular magnetic thin film, on the basis of a ratio w/w1 between the widths in the x direction, of the first magnetic domain and the second magnetic domain. At this time, the image analysis unit 400 may use Equation (1) and Equation (2), which are described above, or may use Equation (2) and Equation (3). The image analysis unit 400 may be a processor.

Figure 3A:
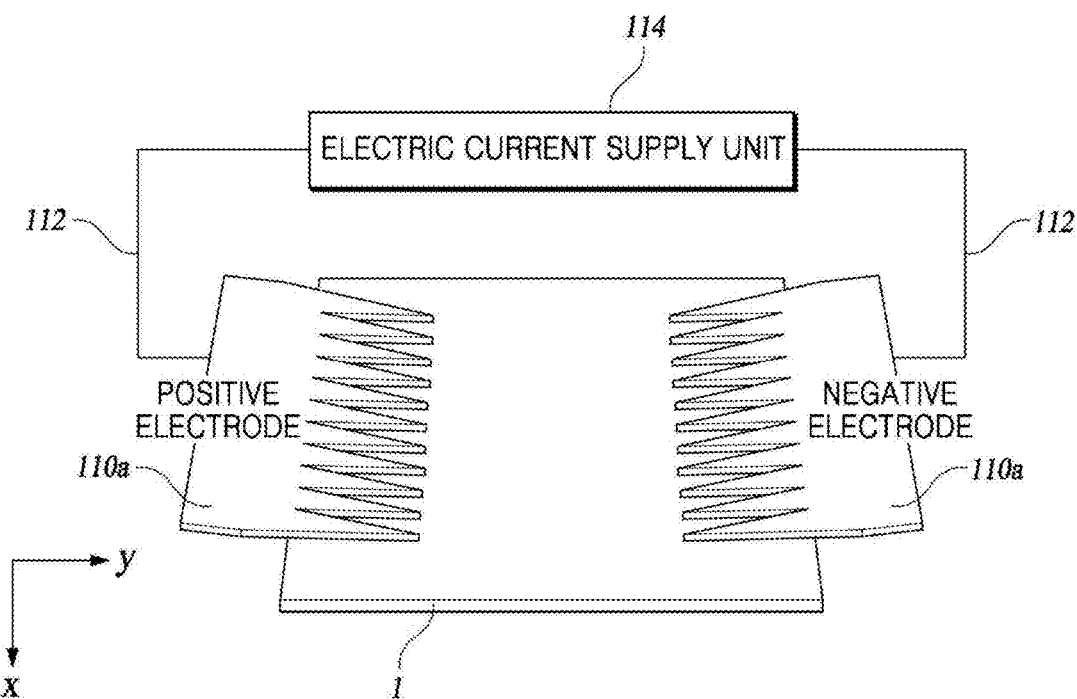
FIG. 3A is a diagram illustrating an example of a pattern formation unit in FIG. 2.

FIG. 3A illustrates an example of the pattern formation unit in FIG. 2. A pattern formation unit 100a may include an electrode 110a that is illustrated in FIG. 3A, and an electric current supply unit 114 that is connected to the electrode 110a through an electric conductor 112 and thus applies electric current to the electrode 110a.

The electrode 110a, as illustrated in FIG. 3A, may include two electrodes that correspond to a positive electrode and a negative electrode, respectively, and each electrode 110a may have a saw-shaped end portion in which teeth are formed to be separated in the x direction by a fixed distance from each other. The end portion of the electrode 110a is brought into contact with the perpendicular magnetic thin film 1. Because electric current concentrates in the end portion of the electrode 110a, it is easy to form the stripe pattern illustrated in FIG. 1A.

Figure 3B:
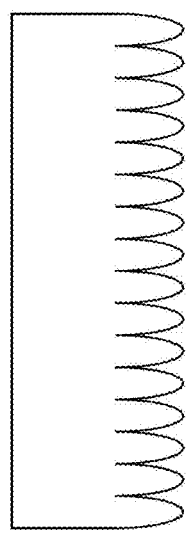
FIGS. 3B and 3C are diagrams, each illustrating a different example of an electrode that is included in the pattern formation unit.
Figure 3C:
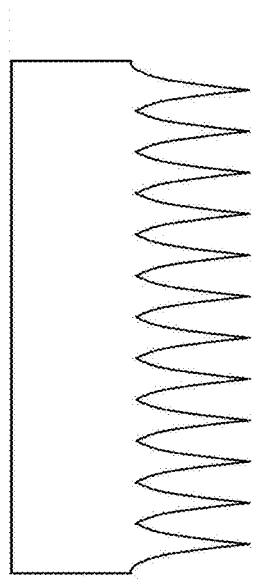

FIGS. 3B and 3C illustrate different examples, respectively, of the electrode that is included in the pattern formation unit 100a. As illustrated in FIG. 3B, an electrode 110b may have an end portion that has blunter teeth than the electrode 110a. As illustrated in FIG. 3C, an electrode 110c may have an end portion that has sharper teeth than the electrode 110a. In each of FIGS. 3B and 3C, only one electrode is illustrated, but as illustrated in FIG. 3A, the pattern formation unit 100a according to each of FIGS. 3B and 3c may include two electrodes that correspond to the positive electrode and the negative electrode, respectively.

Figure 4:
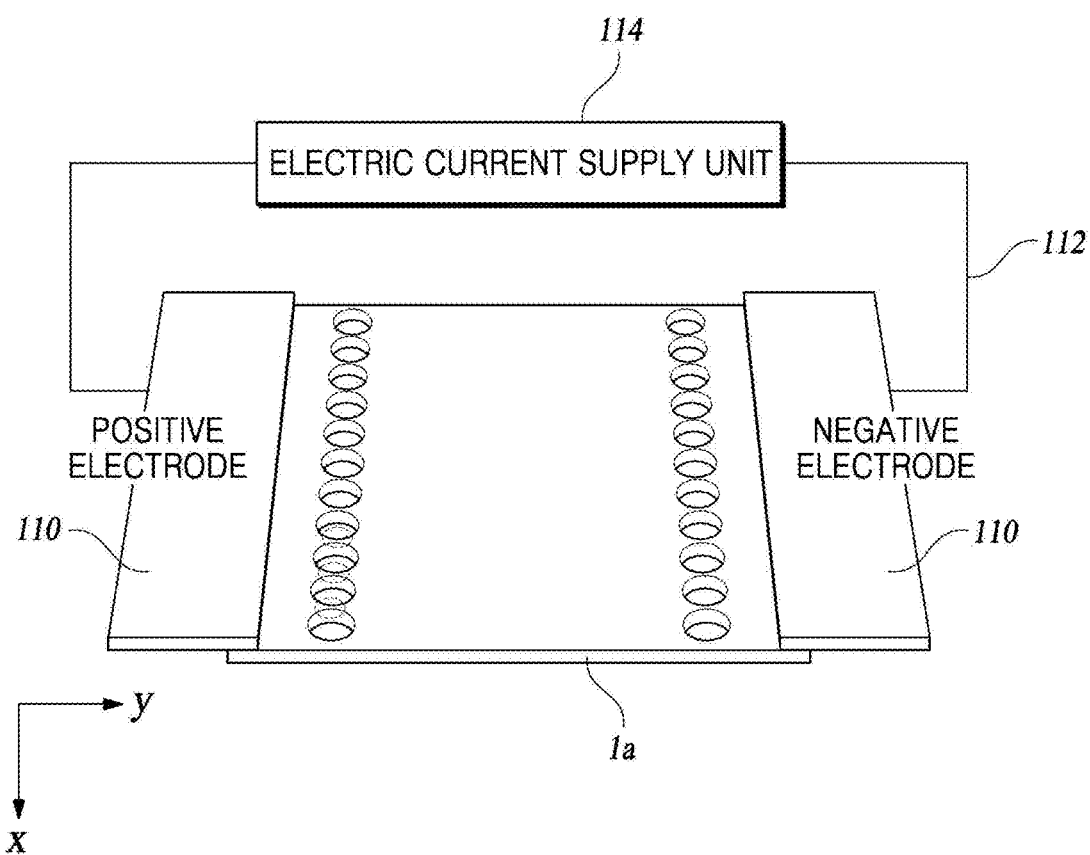
FIG. 4 is a diagram illustrating an example of the pattern formation unit in FIG. 2.

FIG. 4 illustrates an example 100b of the pattern formation unit in FIG. 2. FIG. 4 illustrates the same configuration as FIG. 3A, except that an electrode 110 and a perpendicular magnetic thin film 1a have different shapes than the electrode and the perpendicular magnetic thin film in FIG. 3A.

According to the present embodiment, the electrode 110 in the shape of a rectangle extends along the x direction. Multiple holes are formed in the x direction in the perpendicular magnetic thin film 1a. Accordingly, when flowing from the positive electrode to the negative electrode, electric current concentrates in a portion that is indicated by a dotted circle around the hole. Accordingly, in the same manner as in FIG. 3A, the stripe pattern in FIG. 1A can be formed.

Figure 5:
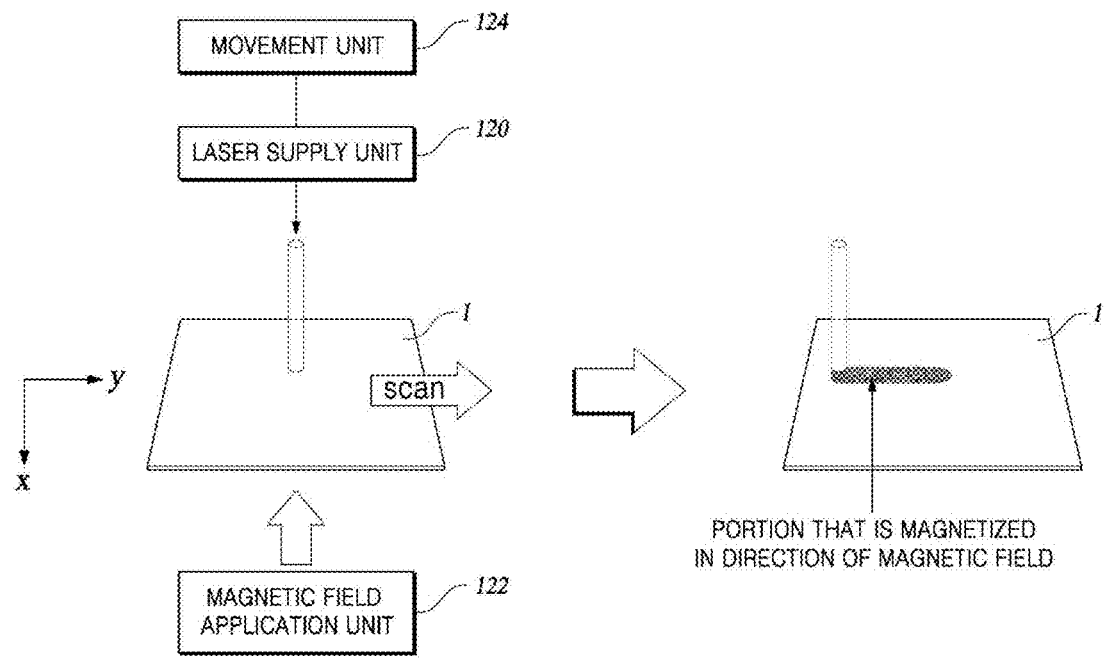
FIG. 5 is a diagram illustrating an example of the pattern formation unit in FIG. 2.

FIG. 5 illustrates an example 100c of the pattern formation unit in FIG. 2.

With reference to FIG. 5, a pattern formation unit 100c may include a laser supply unit 120, a magnetic field application unit 122, and a movement unit 124.

The laser supply unit 120, as illustrated on the left side of FIG. 5, emits a laser to any one point on the perpendicular magnetic thin film 1 and thus heats the perpendicular magnetic thin film 1. The magnetic field application unit 122 applies a magnetic field to the entire perpendicular magnetic thin film 1. Accordingly, in the heated portion of the perpendicular magnetic thin film 1, a magnetization direction is aligned with a direction of the applied magnetic field. The movement unit 124 moves the laser supply unit 120 in the y direction.

Accordingly, as illustrated on the right side of FIG. 5, the first magnetic domain 10 that extends in the y direction can be formed. In the same manner, in a state where the magnetic field is applied in the negative z direction by the magnetic field application unit 122, the laser supply unit 120 moves a position of the laser in the y direction. Thus, the second magnetic domain 20 that extends in the y direction can be formed.

Figure 6A:
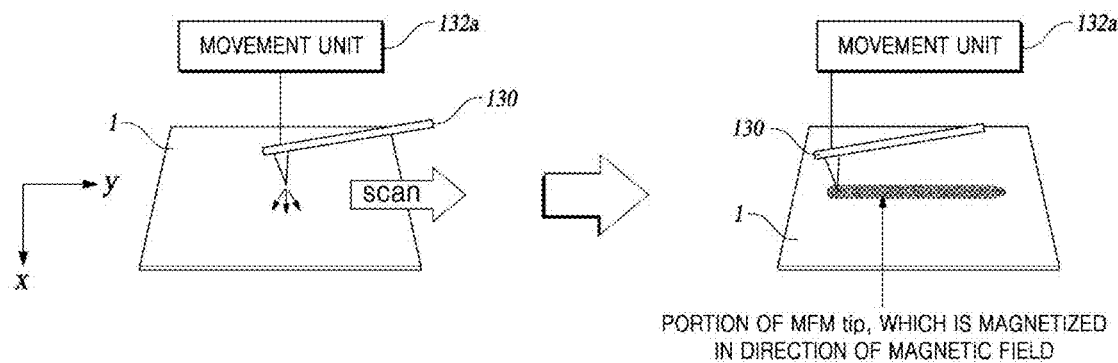
FIGS. 6A and 6B are diagrams, each illustrating an example of the pattern formation unit in FIG. 2.
Figure 6B:
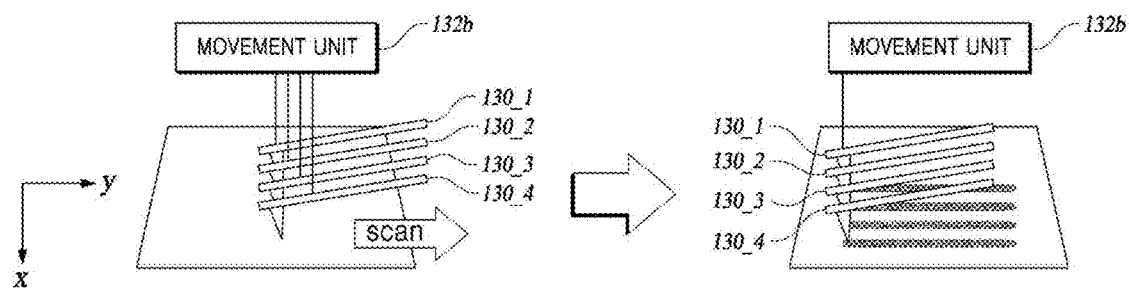

FIGS. 6A and 6B illustrate examples 100d and 100e, respectively, of the pattern formation unit in FIG. 2.

With reference to FIG. 6A, the pattern formation unit 100c may include a magnetic force microscope (MFM) tip 130 and a movement unit 132a.

With reference to the left side of FIG. 6A, because the MFM tip 130 has magnetism in its end portion, a magnetic field occurs in the end portion. Accordingly, when the MFM tip 130 causes the MFM tip to approach the perpendicular magnetic thin film 1, a magnetization state of the perpendicular magnetic thin film 1 in the vicinity of the MFM tip 130 changes. As illustrated on the right side of FIG. 5A, in a state where the MFM tip 130 is caused to approach the perpendicular magnetic thin film 1, the MFM tip 130 is moved in the y direction by the movement unit 132a. Thus, the first magnetic domain 10 or the second magnetic domain 20 in FIG. 1 can be formed.

With reference to FIG. 6B, the pattern formation unit 100d may include multiple MFM tips 130_1, 130_2, 130_3, and 130_4 and a movement unit 132b. The multiple MFM tips 130_1, 130_2, 130_3, and 130_4 are arranged side by side in the x direction. The movement unit 132b moves the multiple MFM tips 130_1, 130_2, 130_3, and 130_4 in the y direction, and thus the stripe pattern, as illustrated in the left side of FIG. 6B, can be formed on the perpendicular magnetic thin film 1.

Next, the image analysis unit 400 will be described. As described above, the image analysis unit 400 calculates the absolute value of the magnetization of the perpendicular magnetic thin film on the basis of the ratio w/w1 between the widths of the first magnetic domain 10 and the second magnetic domain 20. In other words, in order to calculate the absolute value of the magnetization of the perpendicular magnetic thin film, the ratio w/w1 between the widths of the first magnetic domain 10 and the second magnetic domain 20 has to be calculated.

Figure 7A:
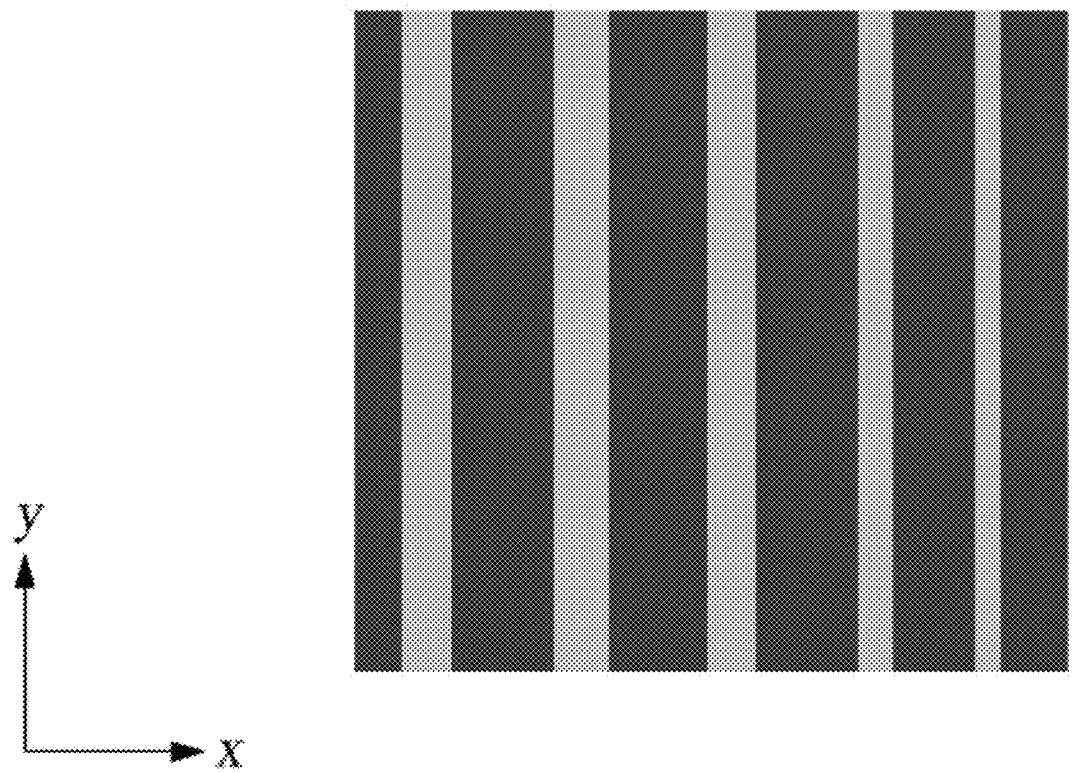
FIGS. 7A and 7B are diagrams, each illustrating an image of the perpendicular magnetic thin film, which is captured by a magnetic imaging unit in FIG. 2.
Figure 7B:
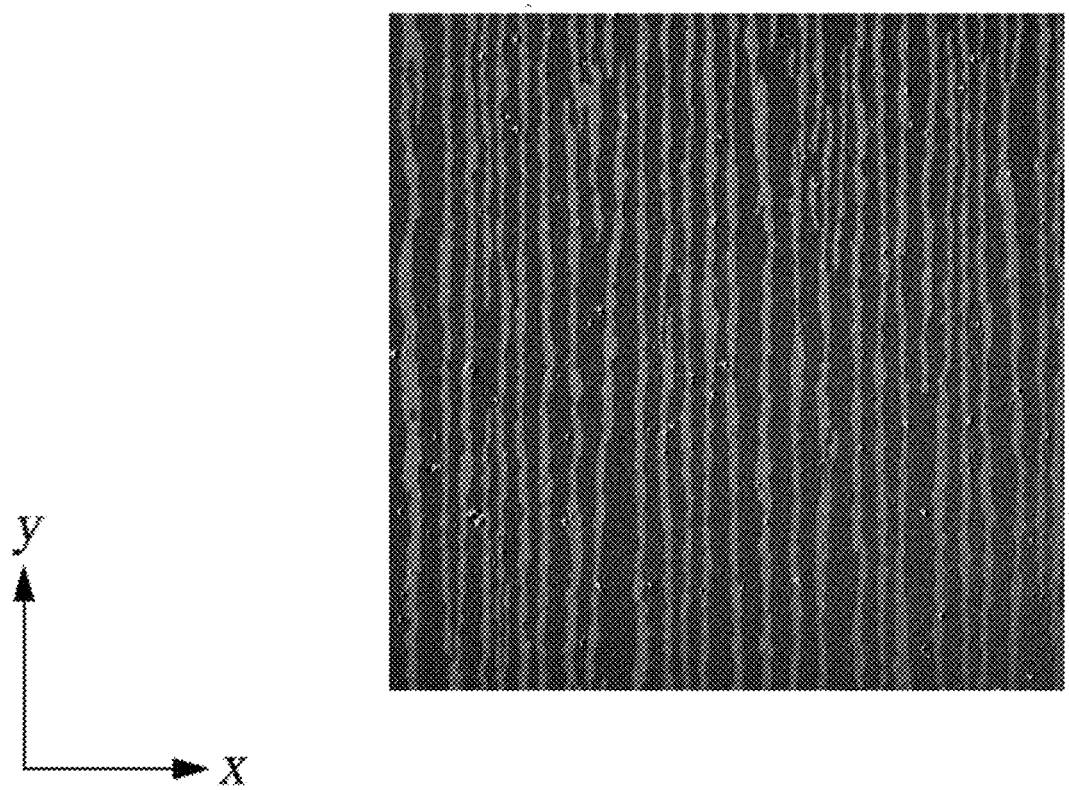

In this connection, FIGS. 7A and 7B illustrate an image of the perpendicular magnetic thin film 1, which is captured by the magnetic imaging unit 300 in FIG. 2. FIG. 7A illustrates an ideal case. FIG. 7B illustrates an actual case.

As illustrated in FIG. 7A, in the ideal case where each of the first magnetic domain 10 and the second magnetic domain 20 has uniform brightness, each of the average of the widths of the first magnetic domain 10 and the average of the widths of the second magnetic domain 20 is calculated, and thus the width w1 of the first magnetic domain 10 and the width w of the second magnetic domain 20 can be easily calculated.

However, as illustrated in FIG. 7B, because the brightness of the first magnetic domain 10 and the brightness of the second magnetic domain 20 are actually non-uniform, a process of analyzing the image of the perpendicular magnetic thin film 1 is necessary in order to calculate the width w1 of the first magnetic domain 10 and the width w of the second magnetic domain 20.

Figure 8:
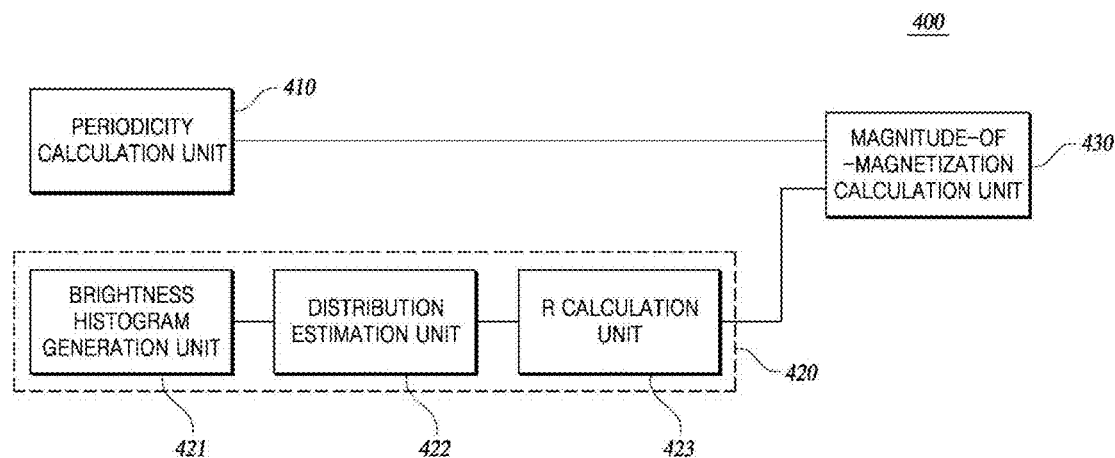
FIG. 8 is a diagram illustrating a configuration of an image analysis unit in FIG. 2.

FIG. 8 is a diagram illustrating a configuration of the image analysis unit 400 in FIG. 2.

With reference to FIG. 8, the image analysis unit 400 may include a periodicity calculation unit 410, an R calculation unit 420, and a magnitude-of-magnetization calculation unit 430.

The periodicity calculation unit 410 calculates a periodicity $\lambda$ of the stripe pattern of the perpendicular magnetic thin film 1. The periodicity $\lambda$ can be calculated by dividing a length in the x direction, of the image of the perpendicular magnetic thin film 1 in FIG. 6B by the number of times that a set which includes the first magnetic domain 10 that appears to be in bright color and the second magnetic domain 20 that appears to be in dark color appears in the x direction.

The R calculation unit 420 calculates R that is defined by Equation (1) or Equation (3), and may include a brightness histogram generation unit 421, a distribution estimation unit 422, and an R calculation unit 423.

The magnitude-of-magnetization calculation unit 430 calculates the magnitude of the magnetization using the periodicity $\lambda$ calculated by the periodicity calculation unit 410, R calculated by the R calculation unit 420, and Equation (2).

Figure 9:
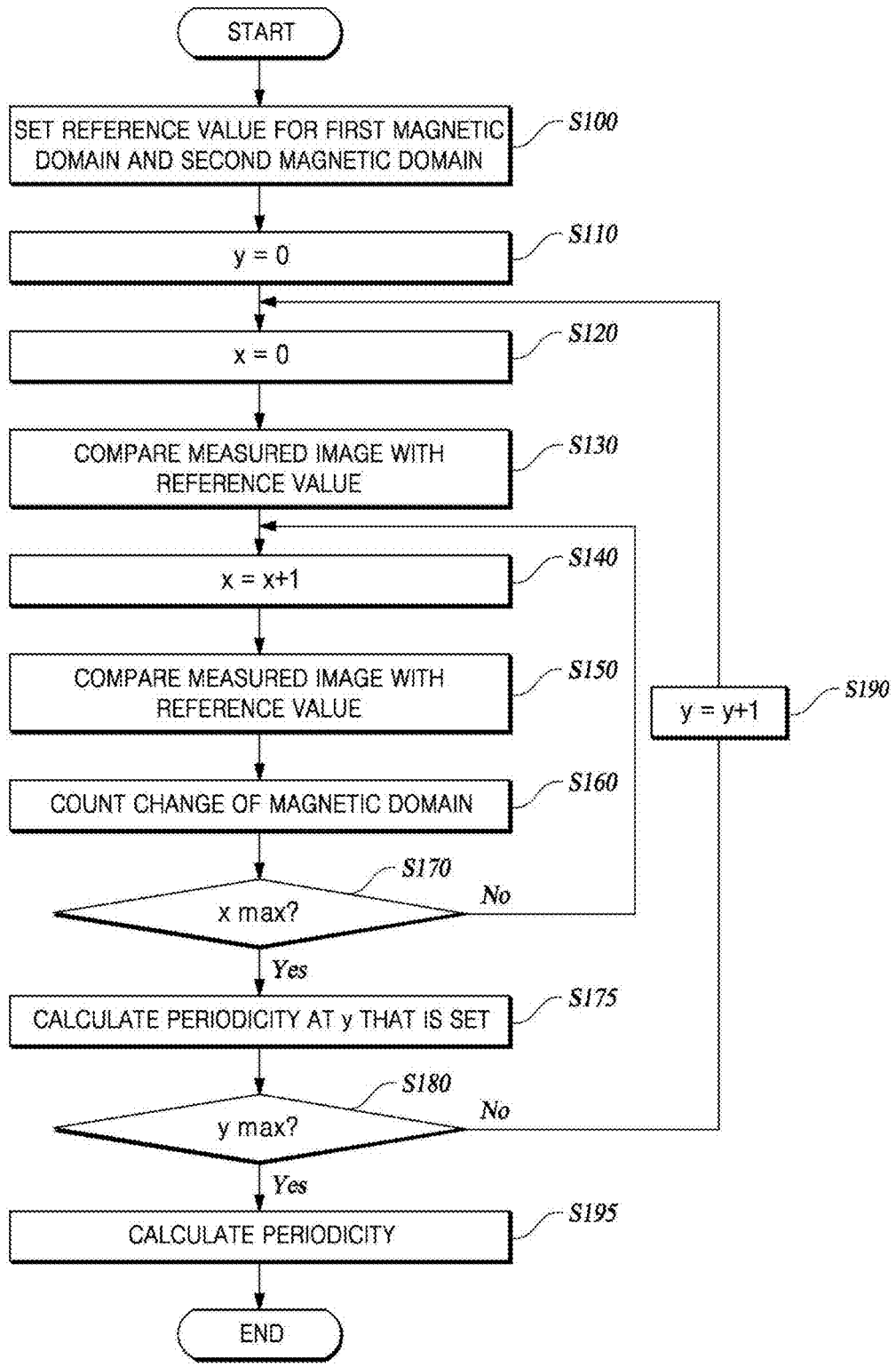
FIG. 9 is a flowchart illustrating processing by a periodicity calculation unit in FIG. 8.

FIG. 9 is a flowchart illustrating processing by the periodicity calculation unit 410 in FIG. 8.

With reference to FIG. 9, the periodicity calculation unit 410 sets a reference value that distinguishes between the first magnetic domain 10 and the second magnetic domain 20 (S100). For example, the reference value can be a median value of the brightness of the first magnetic domain 10 and the brightness of the second magnetic domain 20.

Next, a position in the y direction, of the image of the perpendicular magnetic thin film 1, that is, a y coordinate is set to 0 (S110).

Next, a position in the x direction, of the image of the perpendicular magnetic thin film 1, that is, an x coordinate is set to 0 (S120).

Next, the brightness of the image of the perpendicular magnetic thin film 1 at the coordinates that are set, that is, at (0, 0), is compared with the reference value that is set in Step S100 (S130).

Next, the position in the x direction, of the image of the perpendicular magnetic thin film 1, that is, the x coordinate is increased by 1 (S140). Accordingly, the x coordinate is 1.

Next, the brightness of the image of the perpendicular magnetic thin film 1 at the coordinates that are set, that is, at (1, 0), is compared with the reference value that is set in Step S100 (S150).

Next, a change of the magnetic domain is counted on the basis of a result of the comparison in Step S130 and a result of the comparison in Step S150 (S160). For example, when the brightness at (0, 0) is lower than the reference value in Step S130 and the brightness at (1, 0) is higher than the reference value in Step S150, it can be determined that the magnetic domain is changed. Conversely, when the brightness at (0, 0) is higher than the reference value in Step S130 and the brightness at (1, 0) is lower than the reference value in Step S150, it can be determined that the magnetic domain is changed. Both in a case where the brightness at (0, 0) is higher than the reference value in Step S130, and where the brightness at (1, 0) is higher than the reference value in Step S150, and in a case where the brightness at (0, 0) is lower than the reference value in Step S130, and where the brightness at (1, 0) is lower than the reference value in Step S150, it can be determined that the magnetic domain is not changed.

Next, it is determined whether or not the x coordinate is a maximum value (S170).

When the x coordinate is not the maximum value (S170), the position in the x direction, of the image of the perpendicular magnetic thin film 1, that is, the x coordinate is increased by 1 (S140). Accordingly, the x coordinate is 2.

Next, the brightness of the image of the perpendicular magnetic thin film 1 at the coordinates that are set, that is, at (2, 0), is compared with the reference value that is set in Step S100 (S150).

Next, the change of the magnetic domain is counted on the basis of a result of the comparison in the preceding step S150 and a result of the comparison in the current step S150 (S160). That is, the change of the magnetic domain is counted on the basis of a result of comparing the brightness at (1, 0) with the reference value and a result of comparing the brightness at (2, 0) with the reference value. When the result of comparing the brightness at (1, 0) with the reference value and the result of comparing the brightness at (2, 0) with the reference value are not the same, that is, in a case where one result is higher than the reference value and where the other result is lower than the reference value, it is determined that the magnetic domain is changed. When the result of comparing the brightness at (1, 0) with the reference value and the result of comparing the brightness at (2, 0) with the reference value are the same, it is determined that the magnetic domain is changed.

Steps S150 and S160 are performed varying the x coordinate by increments of 1 until the x coordinate reaches the maximum value. At this time, in Step S160, the change of the magnetic domain can be counted on the basis of a result of comparing the brightness at current coordinates, that is, at (x, 0), with the reference value, and a result of comparing the brightness at preceding coordinates, that is, at (x−1, 0), with the reference value.

When the x coordinate reaches the maximum value (Yes in S170), the number of pairs of the first magnetic domain 10 and the second magnetic domain 20 is calculated by dividing a count value by 2, and a periodicity at a position of which a y coordinate is 0 is calculated by dividing a length on the x axis, of the image of the perpendicular magnetic thin film by the number of the pairs of the first magnetic domain 10 and the second magnetic domain 20 (S175).

Next, it is determined whether or not the y coordinate is a maximum value (S180), and when the y coordinate is not the maximum value (No in S180), the y coordinate is increased by 1 (S190). At this time, a value of a magnetization change counter is initialized to 0. In a case where the y coordinate is 1, Steps S120 to S175, which are described above, are performed to calculate the periodicity.

The periodicity is calculated for each y coordinate, varying the y coordinate by increments of 1 until the y coordinate reaches the maximum value.

When the y coordinate is the maximum (Yes in S180), the average of periodicities that are calculated for y coordinates is calculated and thus a final periodicity $\lambda$ is calculated (S195).

Operation of the periodicity calculation unit 410 is described with reference to FIG. 9 as an example, but the scope of the present invention is not limited to this. For example, instead of calculating periodicities for all y coordinates and calculating the average of the periodicities, a periodicity at a specific y coordinate can be a final periodicity. In addition, in order to improve the reliability of data, images of the perpendicular magnetic thin film 1 may be averaged or an image that results after using a median filter may be used.

Figure 10:
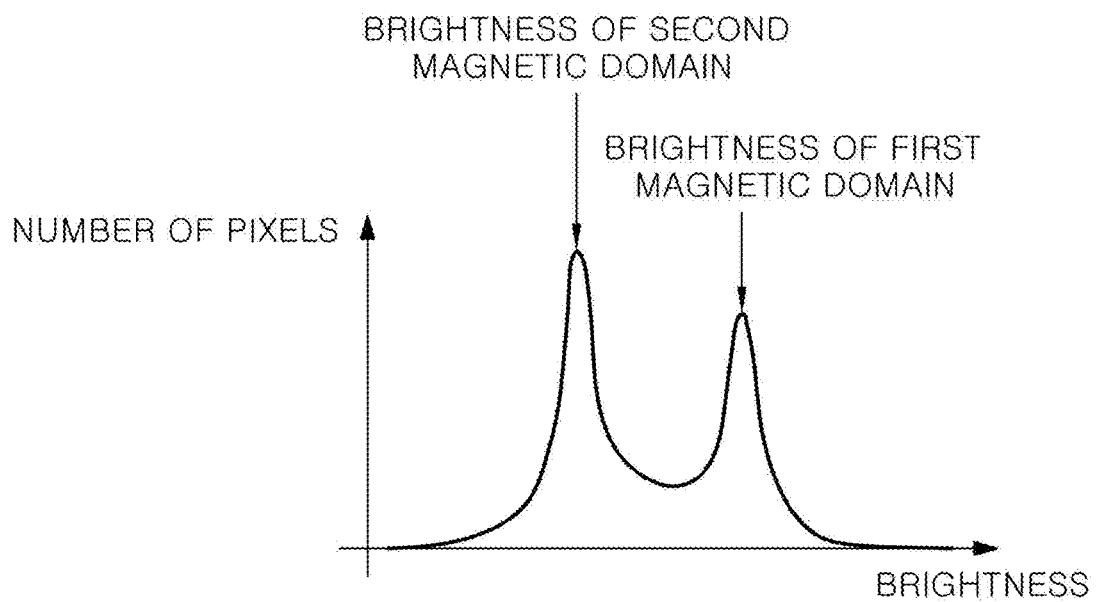
FIG. 10 is a diagram illustrating an example of a histogram showing brightness of the image of the perpendicular magnetic thin film, which is generated by the brightness generation unit in FIG. 8.

FIG. 10 illustrates an example of a histogram showing brightness of the image of the perpendicular magnetic thin film 1, which is generated by the brightness histogram generation unit 421.

The brightness histogram generation unit 421 generates a histogram showing the brightness of each pixel of the image of the perpendicular magnetic thin film 1 in FIG. 7B. At this time, the histogram in FIG. 10 includes two peaks. The brightness of the peaks on the left side is lower than the brightness of the peak on right side, and thus it can be estimated that the peak on the left side is for the second magnetic domain 20 and that the peak on the right side is for the first magnetic domain 10.

Figure 11A:
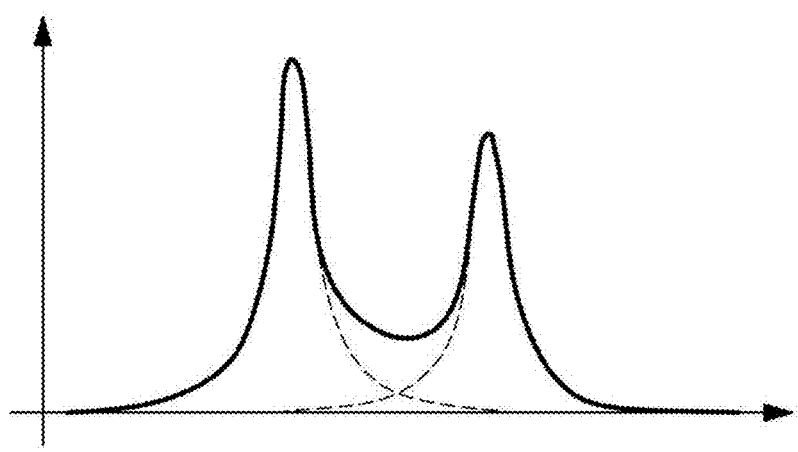
FIGS. 11A, 11B, and 11C are diagrams, each illustrating a distribution in a histogram in FIG. 8, which is estimated by a distribution estimation unit in FIG. 8.
Figure 11B:
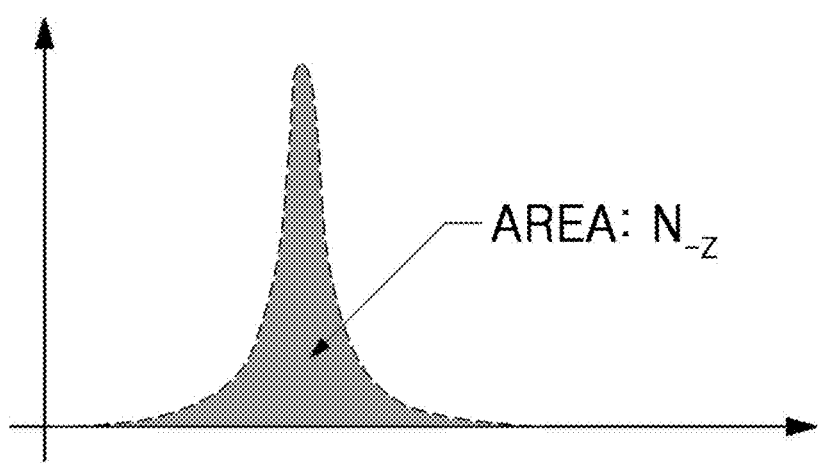
Figure 11C:
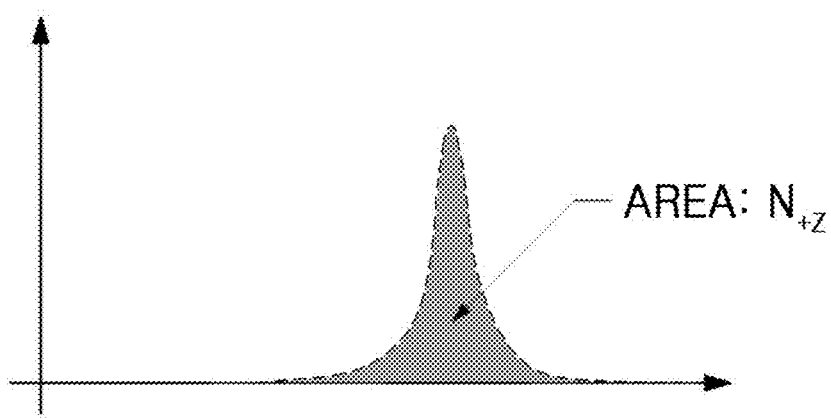

FIGS. 11A, 11B, and 11C are diagrams, each illustrating a distribution in the histogram in FIG. 10, which is estimated by the distribution estimation unit 422.

With reference to FIGS. 11A, 11B, and 11C, the histogram in FIG. 10 is constructed using a sum of two distributions with the two peaks in their respective centers. At this time, each distribution may be a well-defined distribution, such as a Gaussian distribution or a Cauchy distribution. In other words, a distribution in FIG. 11A can be expressed as a sum of a distribution in FIG. 11B and a distribution in FIG. 11C.

When an area of a left distribution of the two distributions, that is, an area of a distribution of the second magnetic domain 20, and an area of a right distribution, that is, an area of a distribution of the first magnetic domain 10 are defined as $N_{-z}$ and $N_{+z}$, respectively, Equation (4) is established from Equation (3).

$$R=(w1-w)/(w1+w)=(N_{+z}-N_{-z})/(N_{-z}+N_{-z}) \qquad (4)$$

The R calculation unit 423 calculates the area $N_{+z}$ of the distribution of the first magnetic domain 10 and the area $N_{-z}$ of the second magnetic domain 20, which are estimated by the distribution estimation unit 422, and calculates R using Equation (4).

With reference back to FIG. 8, the magnitude-of-magnetization calculation unit 430 substitutes the periodicity λ, which is calculated through the steps in FIG. 9, and R, which is calculated with reference to FIGS. 11A, 11B, and 11C and using Equation (4), into Equation (2), and thus can calculate the magnitude of the magnetization.

The preferable embodiment of the present invention is described in detail above, but the present invention is not limited to this. It is apparent to a person of ordinary skill in the art that various modifications and applications are possible within the scope that does not depart from the technical idea of the present invention. Accordingly, the proper scope of the claimed invention should be defined by the following claims. All equivalent technical ideas that fall within the proper scope should be interpreted to be included within the scope of the claimed invention.

What is claimed is:

1. A method of measuring a magnitude of magnetization of a perpendicular magnetic thin film, the method comprising:
    forming a stripe pattern in which a first magnetic domain that extends in a y direction and which is magnetized in a z direction and a second magnetic domain that extends in the y direction and which is magnetized in a direction opposite to the z direction are arranged alternately in an x direction, in a perpendicular magnetic thin film that extends in an xy plane;
    changing widths in the x direction, of the first magnetic domain and the second magnetic domain by applying a magnetic field having a predetermined magnitude, in the z direction, to the perpendicular magnetic thin film; and
    calculating an absolute value of the magnetization of the perpendicular magnetic thin film on the basis of a ratio between the widths in the x direction, of the first magnetic domain and the second magnetic domain.

2. The method according to claim 1, wherein a periodicity λ with the first magnetic domain and the second magnetic domain recurs in the x direction, a width W in the x direction, of the second magnetic domain, a thickness d in the z direction, of the perpendicular magnetic thin film, a magnitude $H_2$ of the magnetic field that is applied in the z direction, and a magnitude M of the magnetization of the perpendicular magnetic thin film satisfy the following equation $$\mu_0 M = \frac{2\lambda}{\pi d} \frac{H_z}{R}$$

where $\mu_0$ denotes a permeability of $4\pi10^{-7}$ H/m, a unit of M is A/m, units of λ, W, and d are m, a unit of $H_2$ is T, and R=(λ−2W)/λ.

3. The method according to claim 2, wherein calculating an absolute value of the magnetization of the perpendicular magnetic thin film comprises:
    generating an image of the perpendicular magnetic thin film in which the widths of the first magnetic domain and the second magnetic domain are changed;
    measuring the periodicity λ with which the first magnetic domain and the second magnetic domain recur, from the image;
    measuring the R from the image; and
    calculating the magnitude of the magnetization of the perpendicular magnetic thin film on the basis of the periodicity and the R.

4. The method according to claim 3, wherein the measuring of the R comprises:
    generating a histogram showing the number of pixels that depends on brightness, from the image of the perpendicular magnetic thin film;
    estimating a distribution of the second magnetic domain that has a peak on the left side of the histogram in the center thereof and a distribution of the first magnetic domain that has a peak on the right side in the center thereof; and
    calculating the R on the basis of an area of the distribution of the first magnetic domain and an area of the distribution of the second domain.

5. The method according to claim 4, wherein in the calculating of the R, when the area of the distribution of the first magnetic domain and the area of the distribution of the second magnetic domain are defined as $N_{+z}$ and $N_{-z}$, respectively, the R satisfies the equation "R=$(N_{+z}-N_{-z})/(N_{+z}+N_{-z})$".

6. An apparatus for measuring a magnitude of magnetization of a perpendicular magnetic thin film, the apparatus comprising:
    a pattern formation unit that forms a stripe pattern in which a first magnetic domain that extends in a y direction and is magnetized in a positive z direction and a second magnetic domain that extends in the y direction and is magnetized in a negative z direction are arranged alternately in an x direction, in a perpendicular magnetic thin film, by supplying electric current to the perpendicular magnetic thin film that extends in an xy plane;
    a magnetic field supply unit that changes widths in the x direction, of the first magnetic domain and the second magnetic domain by applying a magnetic field having a predetermined magnitude, in a z direction, to the perpendicular magnetic thin film; and
    an image analysis unit that calculates the magnitude of the magnetization of the perpendicular magnetic thin film on the basis of a ratio between the widths in the x direction, of the first magnetic domain and the second magnetic domain, which are changed.

7. The apparatus according to claim 6, wherein the pattern formation unit comprises: an electrode that has a saw-shaped end portion in which teeth are arranged in the x direction; and an electric current supply unit that supplies electric current to the electrode, and wherein the saw-shaped end portion is brought into contact with the perpendicular magnetic thin film.

8. The apparatus according to claim 6, wherein the pattern formation unit comprises:
    a second magnetic field supply unit that supplies a magnetic field to the perpendicular magnetic thin film;
    a laser supply unit that emits a laser to any one point on the perpendicular magnetic thin film to which the magnetic field is applied, and thus heats the perpendicular magnetic thin film; and
    a movement unit that moves the laser in the y direction.

9. The apparatus according to claim 6, wherein the pattern formation unit comprises:
 a magnetic force microscope (MFM) tip that has magnetism, generates a magnetic field, and magnetizes the perpendicular magnetic thin film; and
 a second movement unit that moves the MFM in the y direction.

10. The apparatus according to claim 9, wherein the MFM tip comprises multiple MFM tips that are arranged in the x direction, and wherein the second movement unit moves the multiple MFM tips in the y direction at the same time.

11. The apparatus according to claim 6, further comprising:
 a magnetic imaging unit that measures brightness of the perpendicular magnetic thin film to which the magnetic field is applied.

12. The apparatus according to claim 11, wherein the image analysis unit calculates the ratio between the widths in the x direction, of the first magnetic domain and the second magnetic domain on the basis of the brightness of the perpendicular magnetic thin film.

13. The apparatus according to claim 12, wherein the image analysis unit calculates the magnitude of the magnetization of the perpendicular magnetic thin film using the following equation $$\mu_0 M = \frac{2\lambda}{\pi d} \frac{H_z}{R}$$

where $\mu_0$ denotes a permeability of $4\pi 10^{-7}$ H/m, M denotes the magnitude of the magnetization of the perpendicular magnetic thin film, of which a unit is A/m, $\lambda$ denotes a periodicity with which the first magnetic domain and the second magnetic domain recur in the x direction, of which a unit is m, $H_z$ denotes a magnitude of the magnetic field, of which a unit is T, d denotes a thickness in the z direction, of the perpendicular magnetic thin film, of which a unit is m, W denotes the width in the x direction, of the second magnetic domain, of which a unit is m, and $R=(\lambda-2W)/\lambda$.

* * * * *